(12) United States Patent
Ando

(10) Patent No.: US 6,258,731 B1
(45) Date of Patent: Jul. 10, 2001

(54) METHOD FOR FABRICATING OXIDE FILM

(75) Inventor: Koichi Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/294,101

(22) Filed: Apr. 19, 1999

(30) Foreign Application Priority Data

Apr. 24, 1998 (JP) .................................. 10-115151

(51) Int. Cl.$^7$ .......................... H01L 21/31; H01L 21/469
(52) U.S. Cl. ........................................... 438/763; 438/770
(58) Field of Search .................... 438/297, 459, 438/664, 723, 763, 425, 452, 770, 789; 427/55, 58, 81, 94, 255, 88

(56) References Cited

U.S. PATENT DOCUMENTS

| 4,603,059 | * | 7/1986 | Kiyosumi et al. | 427/81 |
| 5,009,926 | * | 4/1991 | Fukuda | 427/55 |
| 5,521,126 | * | 5/1996 | Okamura et al. | 438/789 |

FOREIGN PATENT DOCUMENTS

| 55-44451 | 11/1980 | (JP) . |
| 62-79627 | 4/1987 | (JP) . |
| 62-174923 | 7/1987 | (JP) . |
| 1-145820 | 6/1989 | (JP) . |
| 1-305526 | 12/1989 | (JP) . |
| 6-069195 | 3/1994 | (JP) . |
| 7-297181 | 11/1995 | (JP) . |

* cited by examiner

Primary Examiner—David Nelms
Assistant Examiner—Phuc T. Dang
(74) Attorney, Agent, or Firm—Scully, Scott, Murphy & Presser

(57) ABSTRACT

A method for fabricating a very thin oxide film, such as a gate oxide film of a MOS transistor, by oxidizing a substrate, which method can accurately and easily control the thickness of the oxide film to a desired value. The method comprises controlling thickness of the oxide film to be formed, by adjusting partial pressure of oxygen in an ambient including oxygen, without changing temperature of oxidation of said substrate and time of oxidation of said substrate. Alternatively, the method comprises controlling thickness of the oxide film to be formed, by adjusting only pressure of an oxidizing ambient, without changing temperature of oxidation of said substrate and time of oxidation of said substrate.

31 Claims, 10 Drawing Sheets

METHOD FOR FABRICATING OXIDE FILM

FIELD OF THE INVENTION

The present invention relates generally to a method for fabricating an oxide film, and more particularly to a method for forming a thin oxide film, such as a gate oxide film of a MOS transistor, which can accurately and easily control the thickness of the thin oxide film to a desired value.

BACKGROUND OF THE INVENTION

In the MOS (Metal-Oxide Semiconductor) transistor, an extremely thin gate oxide film or layer is used to improve electric characteristics of the element. At present, a gate oxide film having the thickness of 60 through 70 angstroms is used in a semiconductor device relying on 0.25 micrometer (micron) rule, and a gate oxide film having the thickness of 30 through 40 angstroms is used in a semiconductor device relying on 0.18 micrometer rule. Further, according to the increase in the density of integration of a semiconductor device, a gate oxide film having the thickness of 20 through 30 angstroms is required in a semiconductor device relying on 0.13 micrometer rule.

Since the gate oxide film influences reliability and electrical characteristics of a semiconductor device, it is required that time-zero breakdown voltage is high, that time-dependent degradation is small and that there is no defect at the interface between a semiconductor substrate and the gate oxide film. These characteristics seem to be most superior in case of a thermal oxide film formed by using dry oxidation, that is, oxidation using O2. According to the dry oxidation, Si substrate is heated in O2 ambient or atmosphere, and it is possible to easily form SiO2 film having superior insulating characteristic.

In order to make thin SiO2 film, three methods are conceivable. That is, a method by decreasing oxidation temperature, a method by decreasing oxidation time and a method by decreasing oxidation pressure. Conventionally, among these methods, two methods, i.e., the method by adjusting, i.e., decreasing, oxidation temperature (temperature of heating Si substrate in oxidation ambient) and the method by adjusting, i.e., decreasing, oxidation time (time of heating Si substrate in oxidation ambient) have been used for adjusting the thickness of the SiO2 film formed.

On the other hand, required tolerance of the thickness of the gate oxide film of a MOS transistor becomes strict as the thickness of the gate oxide film becomes thin. For example, when the nominal thickness of a gate oxide film is 60 angstroms, the required tolerance of the thickness of the film is +/−3 angstroms. When the nominal thickness of a gate oxide film is 40 angstroms, the required tolerance of the thickness of the film is +/−2 angstroms. When the nominal thickness of a gate oxide film is 20 angstroms, the required tolerance of the thickness of the film is +/−1 angstrom. In this case, the required tolerance includes dispersion limit of the thickness of the oxide film over a plane of a Si substrate and dispersion limit of the thickness of the oxide films between substrates.

In order to easily fabricate a gate oxide film having high reliability, which is free from inferiority of time-zero breakdown voltage and free from time-dependent degradation and which has a desired film thickness within a required tolerance, the inventor of the present invention newly considered a method for controlling the thickness of a gate oxide film. When oxidation temperature was reduced to realize an oxide film having thin film thickness, it became apparent that there were problems of low time-zero breakdown voltage of the gate oxide film and of increase in the time-dependent degradation. Therefore, when thin SiO2 film is to be formed, it is not preferable to control the film thickness of the SiO2 film by adjusting the oxidation temperature.

The inventor of this application then fabricated a SiO2 film on a Si substrate by thermally oxidizing the Si substrate in oxygen ambient at an oxidation temperature of 1000 degrees Celsius, that is, at a constant oxidation temperature. FIG. 1 is a graph illustrating relation between the formed film thickness of the SiO2 film and oxidation time, i.e., time period heated at 1000 degrees Celsius. In FIG. 1, the relation is shown at each of oxidation pressures, i.e., pressures of oxygen ambient, of 760, 100, 50, 20, and 10 Torr. As shown in FIG. 1, when the oxidation time is changed, the film thickness of the oxide film, i.e., SiO2 film, formed by thermal oxidation depends on the oxidation time. As the oxidation time becomes shorter, the film thickness of the SiO2 becomes thinner. From FIG. 1, it is also found that, as the oxidation pressure becomes lower, the thinner SiO2 film can be formed, when the oxidation time is the same.

As apparent from FIG. 1, when the oxide film having the thickness equal to or thinner than 30 angstroms is to be formed, it is necessary to perform thermal oxidation at a condition of reduced pressure or a decompressed condition, that is, in an oxygen ambient having a pressure less than 760 Torr. For example, when the gate oxide film having the thickness of 20 angstroms required in the 0.13 micrometer rule is to be fabricated, the oxidation pressure is reduced, for example, to 50 Torr, and Si substrate is heated for 20 seconds at 1000 degrees Celsius to form the oxide film. If the oxidation pressure is further reduced, the oxidation time can be elongated.

On the other hand, as the oxidation pressure becomes low, heat conduction through gas molecules is suppressed. Therefore, temperature distribution throughout the surface of the Si substrate becomes non-uniform, so that dispersion of thickness of the formed oxide film within the substrate becomes large. When the oxidation pressure is raised as high as possible to avoid such non-uniformity when the Si substrate is thermally oxidized, it is necessary to shorten oxidation time. However, as apparent from FIG. 1 showing curves illustrating relation between the formed thickness of the SiO2 film and the oxidation time, forming rate of the SiO2 film after some length of time has elapsed, that is, in a time region shown by the curves of FIG. 1, is relatively slow. On the other hand, at the initial stage of the oxide film formation, that is, in a time region not shown by the curves of FIG. 1, forming rate of the SiO2 film is large and a large quantity of SiO2 film is formed in a relatively short time. This is apparent from the fact that the formed thickness of the oxide film is zero when the oxidation time is zero in FIG. 1. Therefore, when the formed thickness of the oxide film is controlled by adjusting the oxidation time and thin gate oxide film is required, it is necessary to adjust the oxidation time to a very short time and to control the oxidation time very precisely.

However, when the oxidation should be performed for a very short time, it is difficult to precisely control the thickness of the oxide film. For example, if a resistance heating furnace is used, the oxide film grows even while taking the Si substrate into and out of the furnace. Therefore, when the oxide film having the thickness equal to or lower than 50 angstroms is formed by this method, it is difficult to form the oxide film precisely in a predetermined film thickness. Also, even if a rapid heating furnace, such as a lamp heating furnace, which can raise and drop temperature in a short time, is used, it is difficult to control the very short oxidation time precisely. Therefore, even when the rapid heating furnace is used, it is difficult to precisely fabricate the oxide film in a predetermined thickness, if the thickness of the oxide film should be, for example, equal to or thinner than 30 angstroms, and if the thickness of the oxide film is controlled by adjusting the oxidation time.

SUMMARY OF THE INVENTION

Therefore, it is an object of the present invention to provide a method for fabricating a very thin oxide film.

It is another object of the present invention to provide a method for fabricating a very thin oxide film precisely in a predetermined thickness.

It is another object of the present invention to provide a method for fabricating a very thin oxide film in which thickness of the film is easily controllable to realize a predetermined thickness.

It is another object of the present invention to provide a method for fabricating a very thin oxide film having small thickness dispersion within a surface of a semiconductor substrate.

It is another object of the present invention to provide a method for fabricating a very thin oxide film having small thickness dispersion between semiconductor substrates.

In a conventional method of fabricating an oxide film in which oxidation time is adjusted to control the thickness of the oxide film, it is difficult to fabricate the oxide film having the thickness equal to or less than 30 angstroms with good controllability. Therefore, the inventor of the present invention intended to control the thickness of an oxide film by changing or adjusting, among several conditions of forming an oxide film, oxidation pressure, without changing oxidation time. In this case, in order to make the thickness control of the oxide film as easily as possible, the inventor paid attention to using the oxidation pressure which is as high as possible even within the condition of reduced oxidation pressure, to using the oxidation time longer than 20 seconds, to suppressing formation of natural or native oxidation film as small as possible, and to stopping oxidation reaction rapidly after a predetermined oxidation time has elapsed. Also, besides the oxidation in the condition of reduced pressure, the inventor found that it is possible to form a very thin oxide film with good controllability by controlling oxygen partial pressure in an oxidizing ambient whose total pressure is relatively high, such as the atmospheric pressure.

According to one aspect of the present invention, there is provided a method for fabricating an oxide film by oxidizing a substrate in an ambient including oxygen to form said oxide film on said substrate. The method comprises controlling thickness of said oxide film to be formed, by adjusting partial pressure of oxygen in said ambient including oxygen.

According to another aspect of the present invention, there is provided a method for fabricating an oxide film by oxidizing a substrate in an oxidizing ambient to form said oxide film on said substrate. The method comprises controlling thickness of said oxide film to be formed, by adjusting pressure of said oxidizing ambient.

According to still another aspect of the present invention, there is provided a method for fabricating an oxide film by oxidizing a silicon substrate in an ambient including oxygen to form a silicon oxide film on said silicon substrate. The method comprises: introducing said silicon substrate into a heating furnace; filling said heating furnace with a mixed gas including oxygen and keeping partial pressure of oxygen gas in the ambient within said heating furnace at a predetermined partial pressure; heating said silicon substrate to a predetermined temperature while keeping said partial pressure of oxygen in said ambient within said heating furnace at said predetermined partial pressure; after the temperature of said silicon substrate reaches said predetermined temperature, maintaining the temperature of said silicon substrate at said predetermined temperature for a predetermined time period, while keeping said partial pressure of oxygen in said ambient within said heating furnace at said predetermined partial pressure; and after maintaining the temperature of said silicon substrate at said predetermined temperature for said predetermined time period, reducing the temperature of said silicon substrate and replacing the ambient within said heating furnace from said mixed gas including oxygen to one or more gases which do not contribute to oxidation.

According to still another aspect of the present invention, there is provided a method for fabricating an oxide film by oxidizing a silicon substrate in an oxidizing ambient to form a silicon oxide film on said silicon substrate. The method comprises: introducing said silicon substrate into a heating furnace; introducing oxygen gas into said heating furnace and keeping pressure of oxidizing ambient within said heating furnace at a predetermined pressure; heating said silicon substrate to a predetermined temperature while keeping said pressure of oxidizing ambient within said heating furnace at said predetermined pressure; after the temperature of said silicon substrate reaches said predetermined temperature, maintaining the temperature of said silicon substrate at said predetermined temperature for a predetermined time period, while keeping said pressure of oxidizing ambient within said heating furnace at said predetermined pressure; and after maintaining the temperature of said silicon substrate at said predetermined temperature for said predetermined time period, reducing the temperature of said silicon substrate and also introducing one or more gases which do not contribute to oxidation into said heating furnace to replace the ambient within said heating furnace from said oxidizing ambient to one or more gases which do not contribute to oxidation, and maintaining pressure of the ambient within said heating furnace higher than said predetermined pressure.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
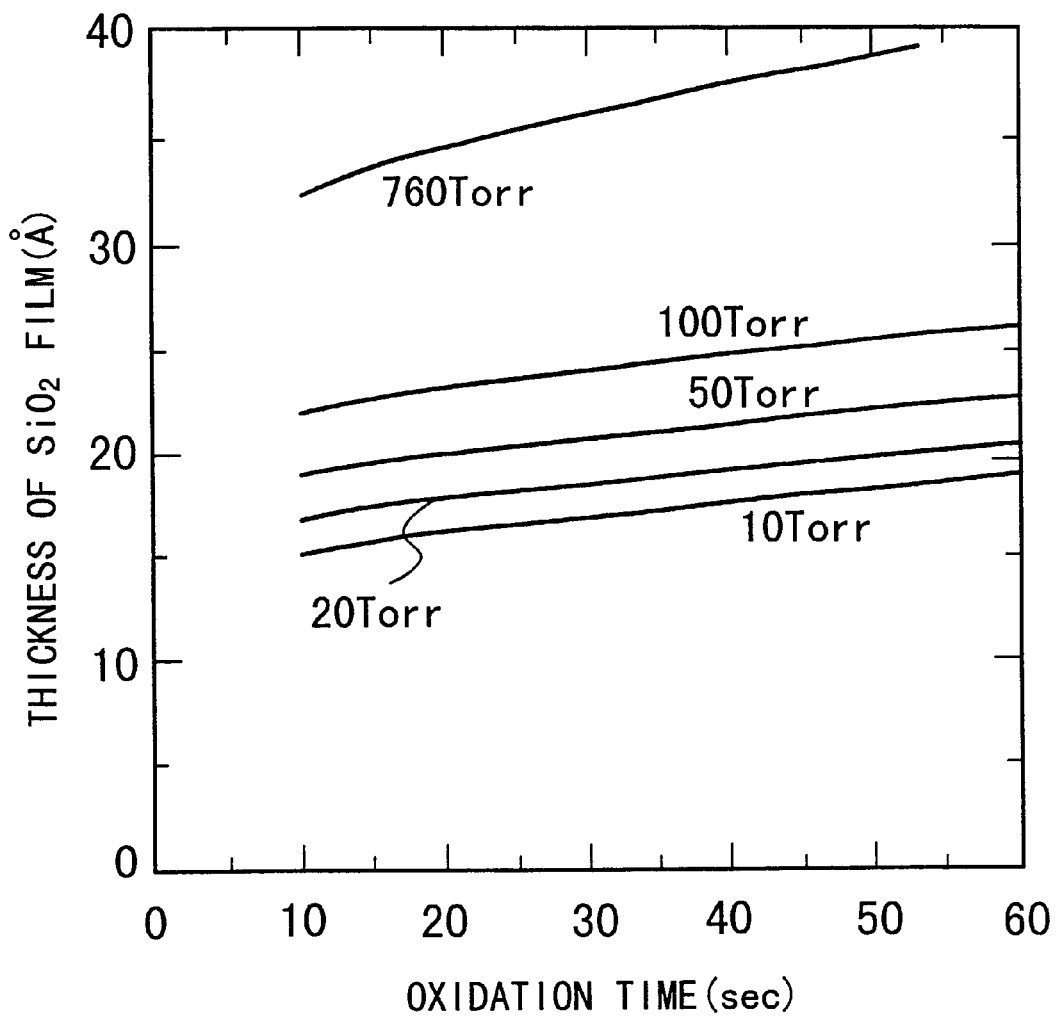
FIG. 1 is a graph showing relations between thickness of a SiO2 film and oxidation time, when the SiO2 film is fabricated by oxidizing a Si substrate in oxygen ambient at oxidizing temperature of 1000 degrees Celsius.
Figure 2:
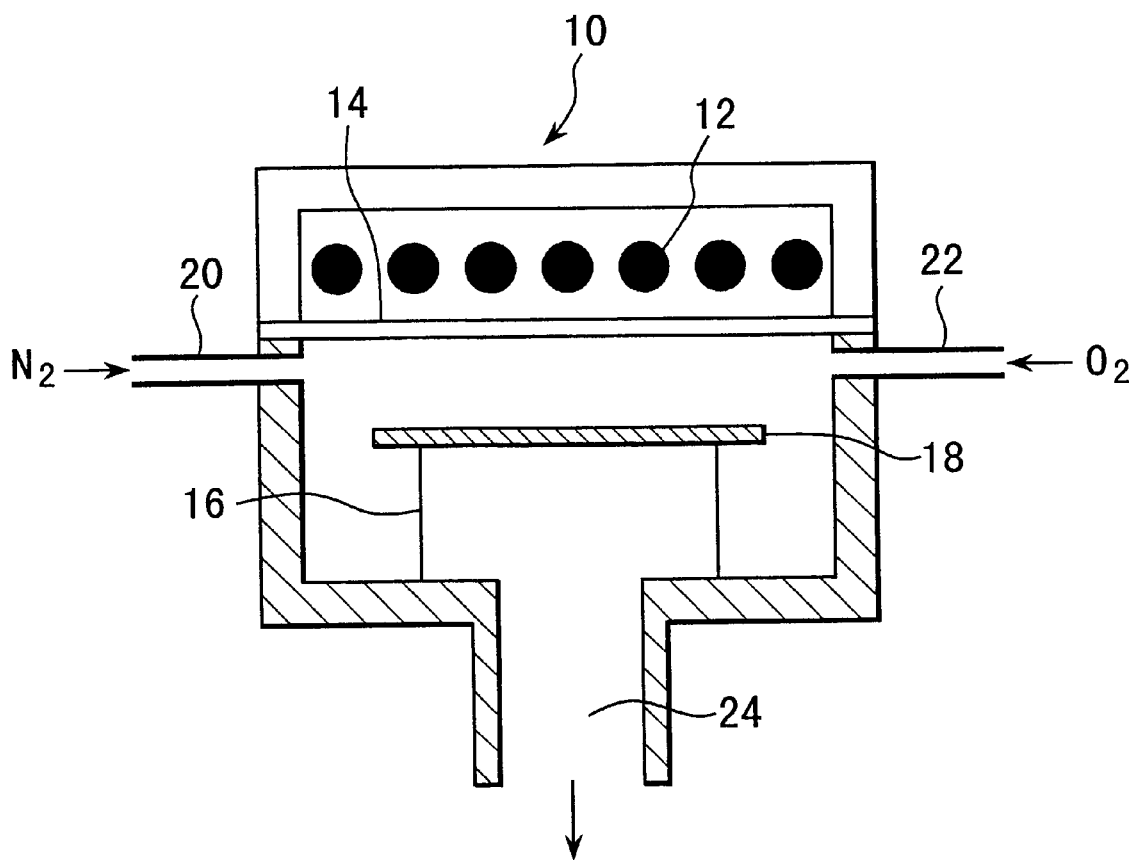
FIG. 2 is a sectional view schematically illustrating a rapid heating furnace used in a method for fabricating an oxide film according to a first embodiment of the present invention.

With reference to the drawings, a method for fabricating an oxide film according to an embodiment of the present invention will be described, in reference to forming a gate oxide film (SiO2) of a MOS transistor. Oxidation is performed by using a rapid heating furnace 10 shown in FIG. 2. The heating furnace 10 comprises halogen lamps 12. The halogen lamps 12 heat a silicon (Si) substrate 18 supported on substrate support bars 16 and disposed within the heating furnace 10, via a quartz window 14. Also, the heating furnace 10 comprises gas inlets 20 and 22, and a gas outlet 24. It is also possible to couple the gas outlet 24 with a vacuum pump not shown in the drawing, if, for example, it is required to quickly replace the ambient gas within the heating furnace 10.

In this constitution, after a Si substrate 18 is introduced into the heating furnace 10, necessary gases are introduced into the heating furnace 10 and the Si substrate 18 is heated by the halogen lamps 12 to change or raise temperature of the Si substrate 18. The temperature of the Si substrate 18 is controlled into a predetermined temperature pattern, by adjusting the intensity of light from the halogen lamps 12 using a temperature controller not shown in the drawing. The temperature controller can also be constituted, for example, of a microcomputer including a stored program for generating temperature patterns. Also, gases introduced into the heating furnace 10 are evacuated from the gas outlet 24, and thereby pressure within the heating furnace 10 is kept substantially at the atmospheric pressure (approximately 760 Torr). The pressure within the heating furnace 10 can be higher or lower than the atmospheric pressure. For example, the pressure within the heating furnace 10 may be somewhat higher than the atmospheric pressure such that evacuation from the gas outlet can be done smoothly.

Figure 3:
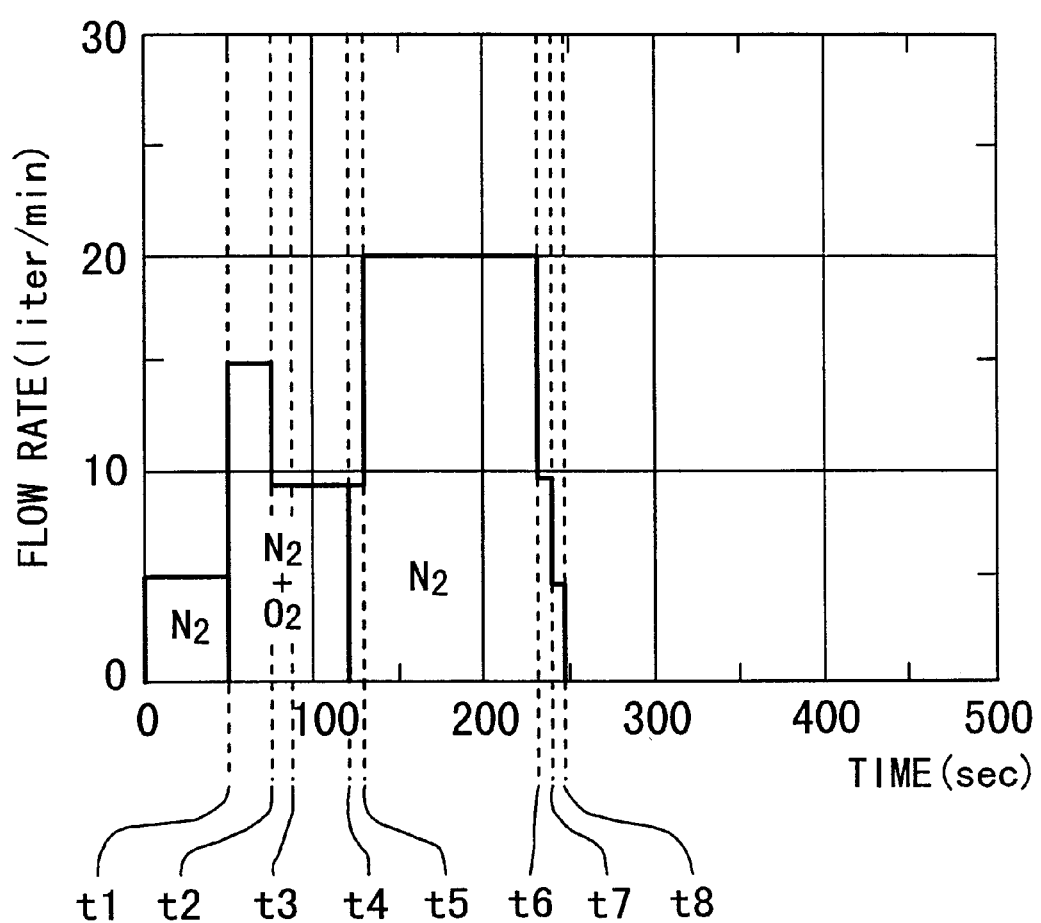
FIG. 3 is a graph showing change of flow rates of gases introduced into a heating furnace with respect to time, in a method for fabricating an oxide film according to the first embodiment of the present invention.
Figure 4:
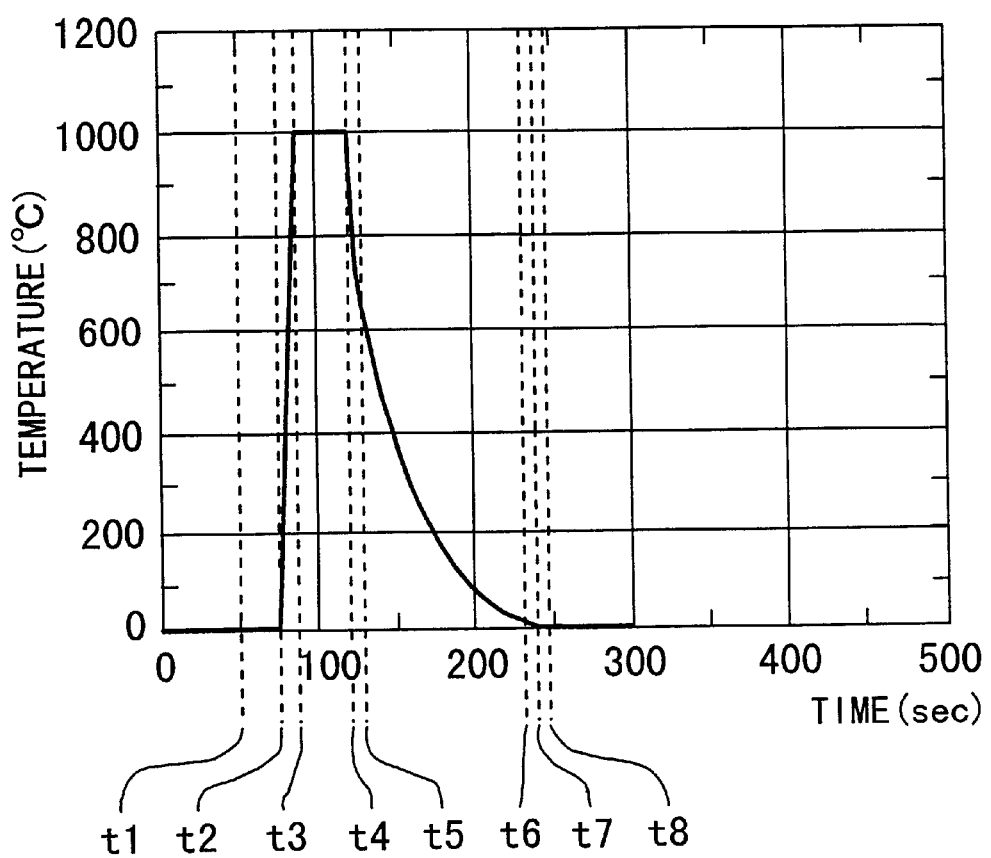
FIG. 4 is a graph showing change of temperature of a Si substrate in a heating furnace with respect to time, in a method for fabricating an oxide film according to the first embodiment of the present invention.

A method for fabricating an oxide film according to this embodiment will now be explained in further detail with reference to the drawings. FIG. 3 illustrates variation of flow rate (liter/minute) of gases introduced into the heating furnace 10 in this embodiment with respect to time. FIG. 4 illustrates variation of temperature (degree Celsius) of the Si substrate 18 in the heating furnace 10 with respect to time, in this case.

First, a Si substrate 18 is introduced into the heating furnace 10 and placed on the substrate supporting bars 16. Thereafter, as shown in FIG. 3, nitrogen gas (N2) is introduced into the heating furnace 10 from the gas inlet 20 at a flow rate of, for example, 5 liters/minute. For the sake of easy understanding, the point of time at which the introduction of the nitrogen gas is started or a point of time during the introduction of the nitrogen gas is determined as the origin of the time axis (abscissa) of the graphs of FIG. 3 and FIG. 4. As another method, it is possible to introduce the Si substrate 18 into the heating furnace 18 and place it on the substrate support bars 16 after the heating furnace 18 is filled with the nitrogen gas.

One of the reasons for introducing nitrogen gas into the heating furnace 10 is to prevent formation of natural oxide film on the surface of the Si substrate 18, by filling the heating furnace 10 with nitrogen gas. If the natural oxide film is formed, the final thickness of the SiO2 film to be formed disperses, and it is difficult to precisely control the film thickness to a predetermined value. It is also possible to introduce a very small quantity, for example, 100 ppm, of oxygen together with the nitrogen into the heating furnace 10, in order to avoid occurrence of the roughness of the surface of the Si substrate 18. Also, other reason for introducing nitrogen gas is to replace ambient or atmosphere within the heating chamber 10 by a gas which does not include oxygen (here, nitrogen gas), and to make control of oxygen partial pressure thereafter easier.

As shown in FIG. 3, at time t1 (for example, 50 seconds after t0), flow rate of nitrogen gas introduced into the heating furnace 10 from the gas inlet 20 is increased to, for example, 14 liters/minute, and introduction of oxygen gas (O2) is started into the heating furnace 10 from the gas inlet 22 at a flow rate, for example, of 1 liter/minute. It should be noted that, in FIG. 3, total flow rate of the flow rate of nitrogen gas and the flow rate of oxygen gas is indicated as "N2+O2". The ambient within the heating furnace 10, that is, the ambient around the Si substrate 18, is replaced from the gas comprising 100 percent nitrogen to a mixed gas comprising nitrogen gas introduced from the gas inlet 20 and oxygen gas introduced from the gas inlet 22. Partial pressure of oxygen in the ambient comprising this mixed gas within the heating furnace 10 is approximately 50 Torr as apparent from the ratio of flow rates of nitrogen gas versus oxygen gas, that is, approximately 710 versus 50. In this case, total pressure within the heating furnace 10 is substantially the same as the atmospheric pressure, i.e., approximately 760 Torr.

Further, at time t2, flow rate of nitrogen gas introduced from the gas inlet 20 into the heating furnace 10 is reduced, for example, to 8.4 liters/minute, and flow rate of oxygen gas introduced from the gas inlet 22 into the heating furnace 10 is reduced, for example, to 0.6 liter/minute. It should be noted that, although each of the flow rates of nitrogen gas and oxygen gas is reduced, the ratio between the flow rate of nitrogen gas and the flow rate of oxygen gas is the same as before, that is, approximately 710 versus 50. Therefore, from the time t1 to the time t4, partial pressure of oxygen of the mixed gas comprising nitrogen gas and oxygen gas filling the heating furnace 10 is approximately 50 Torr and constant.

The reason for setting the flow rate from the time t1 to the time t2 larger than the flow rate from the time t2 to the time t4 is to quickly replace the ambient within the heating furnace 10 from the gas comprising 100 percent nitrogen and having pressure of approximately 760 Torr to the mixed gas whose partial pressure of oxygen is approximately 50 Torr and whose total pressure is approximately 760 Torr. When it is required to set the partial pressure of oxygen of the mixed gas to a different value, for example, 100 Torr, the ratio of flow rates of nitrogen gas versus oxygen gas can be adjusted to approximately 660 versus 100.

In the above constitution, nitrogen gas and oxygen gas are mixed within the heating furnace 10 by introducing nitrogen gas from the gas inlet 20 and by introducing oxygen gas from the gas inlet 22. However, it is possible to mix nitrogen gas and oxygen gas to prepare a mixed gas before introducing them into the heating furnace 10, and to introduce the mixed gas into the heating furnace 10 via, for example, the gas inlet 22. In this case, partial pressure of oxygen of the ambient within the heating furnace 10 into which the above-mentioned mixed gas is introduced via the gas inlet 22 can be controlled by previously adjusting the mixing ratio, i.e., ratio of flow rates, of nitrogen gas and oxygen gas when both gases are mixed before introducing them into the heating furnace 10.

As shown in FIG. 4, at time t2, for example, approximately 75 seconds after t0, heating of the Si substrate 18 by the halogen lamps 12 is started. Thereby, temperature of the Si substrate 18 starts to rise, and at time t3, for example, approximately 90 seconds after t0, the temperature of the Si substrate 18 reaches a steady oxidation temperature, for example, approximately 1000 degrees Celsius. As shown in FIG. 4, the temperature of the Si substrate 18 is maintained at this oxidation temperature (approximately 1000 degrees Celsius) between the time t3 and the time t4, for example, for approximately 30 seconds. By the oxidation during this time period, a silicon oxidation film, i.e., silicon dioxide ($SiO_2$) film, having the thickness of, for example, approximately 20 angstrom is formed on the Si substrate 18.

As shown in FIG. 4, at time t4, for example, approximately 120 seconds after t0, heating of the Si substrate 18 by the halogen lamps 12 is stopped, and thereafter entering into a temperature falling down process. On the other hand, as shown in FIG. 3, at time t4, introduction of oxygen gas from the gas inlet 22 is stopped, and flow rate of nitrogen gas introduced from the gas inlet 20 is increased, for example, to approximately 9 liters/minute. Thereby, the ambient within the heating furnace 10 is replaced from the mixed gas, having partial pressure of oxygen of approximately 50 Torr, to a gas comprising 100 percent nitrogen. Therefore, after the time t4, substantially no $SiO_2$ film is formed on the Si substrate 18.

Thereafter, as also shown in FIG. 4, at time t5, for example, 130 seconds after t0, flow rate of nitrogen gas is increased, for example, to approximately 20 liters/minute. Then, flow rate of nitrogen gas is reduced stepwise to, for example, approximately 10 liters/minute at time t6, for example, approximately 230 second after t0, and to, for example, 5 liters/minute at time t7. Finally, introduction of nitrogen gas is stopped at time t8, for example, approximately 245 seconds after time t0. It is possible to keep the flow rate of nitrogen gas introduced into the heating furnace 10 from the gas inlet 20 at a constant value, for example, 9 liters/minute, from the time t4 until the time the temperature of the Si substrate 18 returns to the start temperature, for example, near the room temperature, and thereafter to stop introduction of nitrogen gas into the heating furnace 10. It is also possible to keep the heating furnace 10 filled with nitrogen gas, until the Si substrate 18 is taken out from the heating furnace 10.

After the time t8, temperature of the Si substrate 18 returns approximately to the room temperature, and, therefore, after, for example, 300 seconds from the time t0, it is easily possible to take out the Si substrate 18 from the heating furnace 10. In the actual experiment performed as mentioned above, the thickness of the $SiO_2$ film formed on the Si substrate 18 was approximately 20 angstroms and error thereof was within +/−1 angstrom. During the time period the $SiO_2$ film is formed, total pressure of the ambient within the heating furnace 10, that is, the ambient around the Si substrate 18, is substantially the atmospheric pressure. Therefore, enough heat conduction is performed by the ambient gases, and temperature distribution throughout the Si substrate becomes uniform, so that the formed thickness of the $SiO_2$ film becomes uniform within the surface of the Si substrate 18. Also, during the time period the $SiO_2$ film is formed, partial pressure of oxygen in the ambient around the Si substrate 18 is relatively low, which is approximately 50 Torr in this example, and therefore, a very thin $SiO_2$ film such as approximately 20 angstroms can be fabricated.

Figure 5:
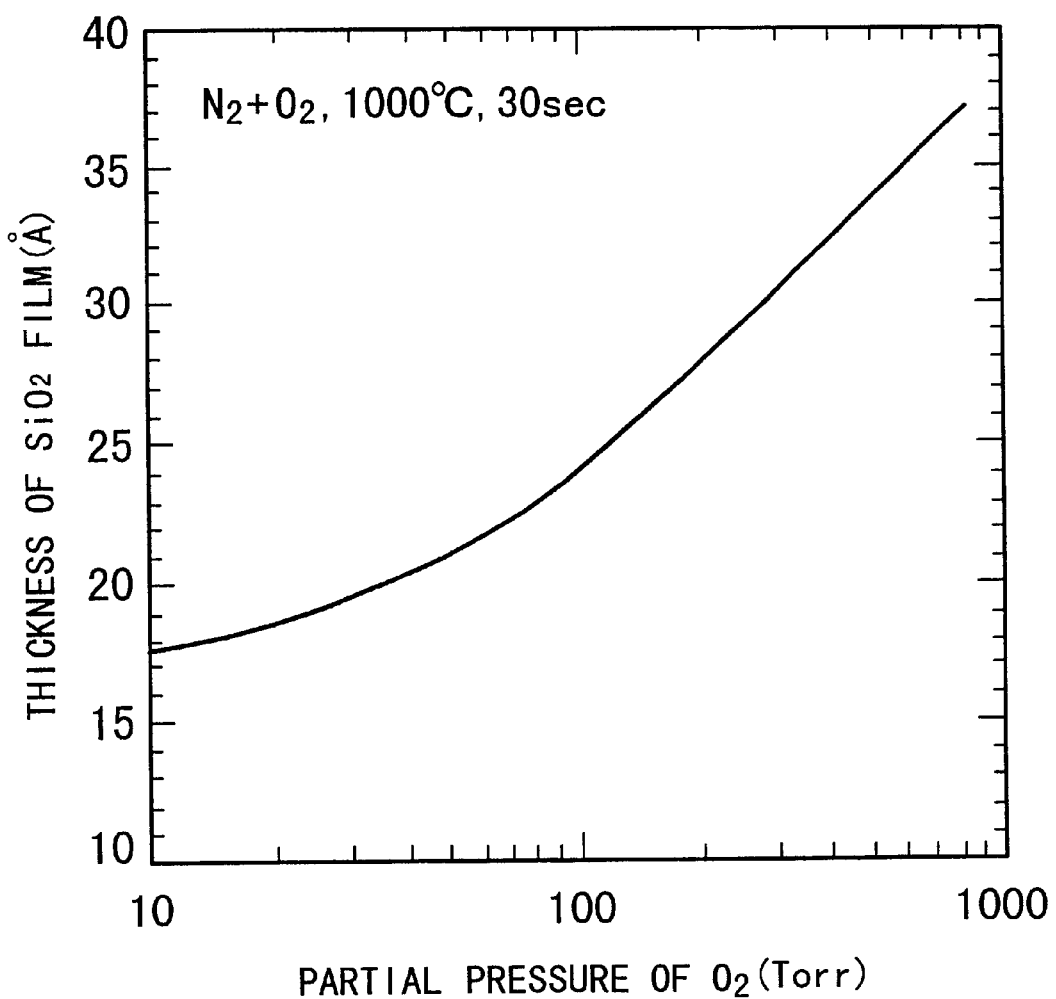
FIG. 5 is a graph showing a relation between film thickness of a formed SiO2 film versus oxygen partial pressure, when a Si substrate is oxidized at an oxidation temperature of 1000 degrees Celsius and oxidation time of 30 seconds, and when only oxygen partial pressure is changed, to form SiO2 film.

FIG. 5 is a graph showing a relation between the thickness of a formed $SiO_2$ film and partial pressure of oxygen when the $SiO_2$ film is formed on a Si substrate while varying partial pressure of oxygen, that is, partial pressure of oxygen in heating furnace 10 during the time t3 through the time t4. In this case, oxidation temperature, that is, temperature of the Si substrate during the time t3 through t4 in FIG. 4, is maintained at 1000 degrees Celsius, and oxidation time, that is, time period from t3 to t4, is fixed to 30 seconds. From the graph of FIG. 5, it is found that the $SiO_2$ film having the thickness of 20 angstroms can be fabricated in the partial pressure of oxygen of approximately 35 Torr. As apparent from FIG. 5, when the thickness of the $SiO_2$ film should be controlled to become any desired value, it is only necessay to change or adjust the partial pressure of oxygen depending on the required film thickness, while maintaining the conditions of oxidation temperature and oxidation time at constant values, for example, 1000 degrees Celsius and 30 seconds, respectively. For example, when the oxidation temperature is maintained at 1000 degrees Celsius and the oxidation time is fixed to 30 seconds, partial pressure of oxygen may be adjusted to approximately 35 Torr if the $SiO_2$ film having the thickness of 20 angstroms should be formed, to approximately 110 Torr if the $SiO_2$ film having the thickness of 25 angstroms should be formed, and to approximately 300 Torr if the $SiO_2$ film having the thickness of 30 angstroms should be formed. The partial pressure of oxygen can be easily and precisely controlled, for example, by adjusting the ratio of flow rates between nitrogen gas and oxygen gas. Also, it is possible to control the formed thickness of the $SiO_2$ film by adjusting the partial pressure of oxygen, while the oxidation temperature and the oxidation time are fixed to other values, for example, an arbitrary value approximately between 900 and 1200 degrees Celsius and an arbitrary value equal to or larger than approximately 20 seconds, respectively. In this case, although the partial pressure of oxygen can be adjusted to any value within an implementable pressure range, it is practically more preferable to use a value within a range between approximately 10 and 700 Torr.

According to the method for fabricating an oxide film of this embodiment, it is possible to form the $SiO_2$ film having a desired thickness very precisely, and to control the thickness of the $SiO_2$ film easily and precisely. Especially, thickness of a thin $SiO_2$ film having the thickness of, for example, approximately 20 through 30 angstroms can be controlled properly. Also, since, during formation of the SiO2 film, the total pressure of the ambient around the Si substrate is relatively high, and in this embodiment is substantially the atmospheric pressure, temperature distribution is substantially uniform over and throughout the Si substrate 18. Therefore, the SiO2 film having uniform thickness can be formed on the Si substrate. Further, the formed thickness of the SiO2 film can be controlled only by adjusting the partial pressure of oxygen which is controllable by changing the gas flow rate, special apparatus is not required and manufacturing costs can be reduced. Also, it is possible to fabricate oxide films having various thicknesses easily and precisely by using a common apparatus.

It should be noted that, in place of or in addition to nitrogen gas, it is possible to use other gases such as helium gas (He), argon gas (Ar) and the like which do not contribute to oxidation, inert gases, or gases which do not react with Si substrate.

Figure 6:
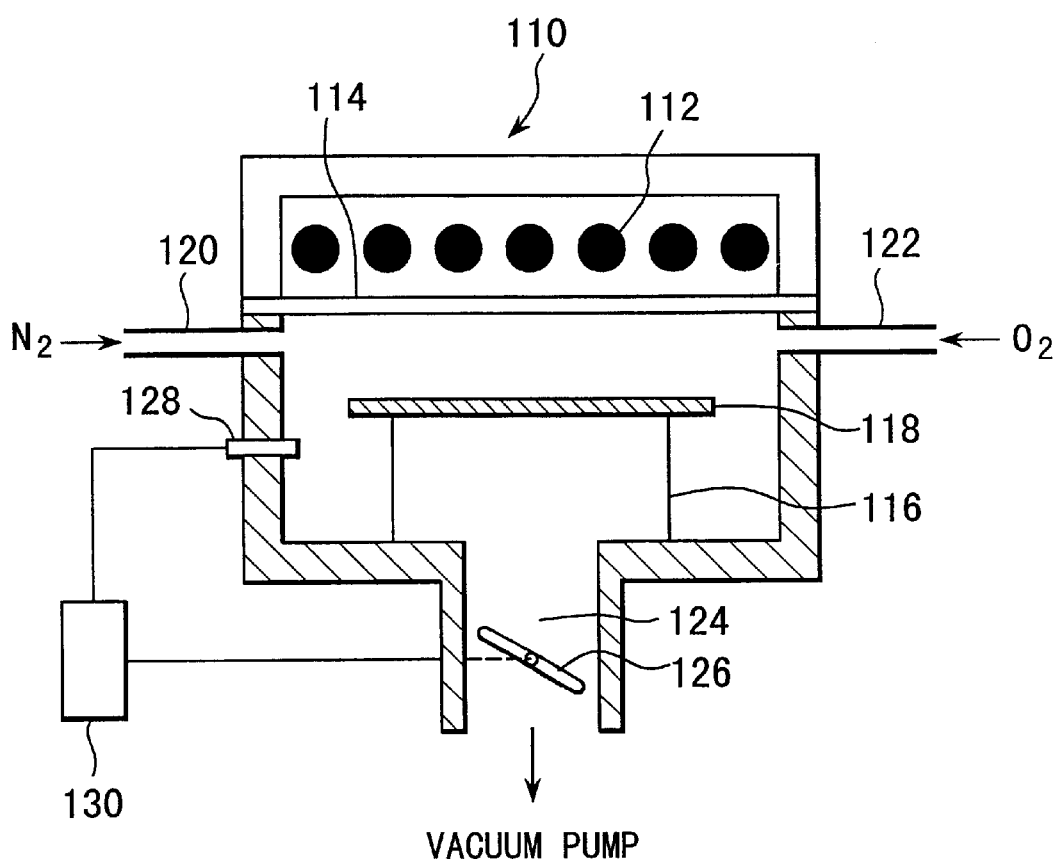
FIG. 6 is a sectional view schematically illustrating a rapid heating furnace used in a method for fabricating an oxide film according to a second embodiment of the present invention.

Now, a method for fabricating oxide film according to a second embodiment of the present invention will be described in reference to a case of fabricating a gate oxide film (SiO2) of a MOS transistor. In this case, oxidation is performed by using a rapid heating furnace 110 which uses halogen lamps 112 and which is illustrated in FIG. 6. The halogen lamps 112 provided in the heating furnace 110 heat a silicon (Si) substrate 118 within the heating furnace 110 through a quartz window 114. The Si substrate 118 is supported on substrate supporting bars 116 within the heating furnace 110. Also, the heating furnace 110 comprises gas inlets 120 and 122, and a gas outlet 124. In the gas outlet 124, a valve 126 is provided for adjusting rate of opening or shutting of the outlet 124. In place of the valve 126, any other means such as an adjustable blocking plate which is movable to adjust the rate of opening or shutting of the outlet 124 can be used. The gas outlet 124 is coupled with a vacuum pump not shown in the drawing which can evacuate the heating furnace 110. Also, there is provided a pressure gage or a vacuum gage 128 for measuring a pressure within the heating furnace 110, that is, a pressure of the ambient around the silicon substrate 118. There is also provided a pressure controller 130 composed, for example, of a microcomputer for controlling pressure within the heating furnace 110. That is, the pressure controller 130 adjust the rate of opening, or the angular position of the blocking plate, of the valve 126 based on the pressure within the heating furnace 110 measured and fed back by the pressure gage 128 and on a program stored in the pressure controller 130, so that desired pressure control patterns are realized.

In the constitution of FIG. 6, after the Si substrate 118 is introduced into the heating furnace 110, necessary gases are introduced into the furnace 110 and temperature of the Si substrate 118 is changed by heating it by the halogen lamps 112. The temperature of the Si substrate 118 is controlled into a predetermined temperature pattern, by adjusting light intensity of the halogen lamps 112 by using a temperature controller not shown in the drawing. The temperature controller can also be constituted, for example, of a microcomputer including a stored program for generating temperature patterns. It is also possible to compose the temperature controller and the above-mentioned pressure controller 130 by using a common microcomputer.

Figure 7:
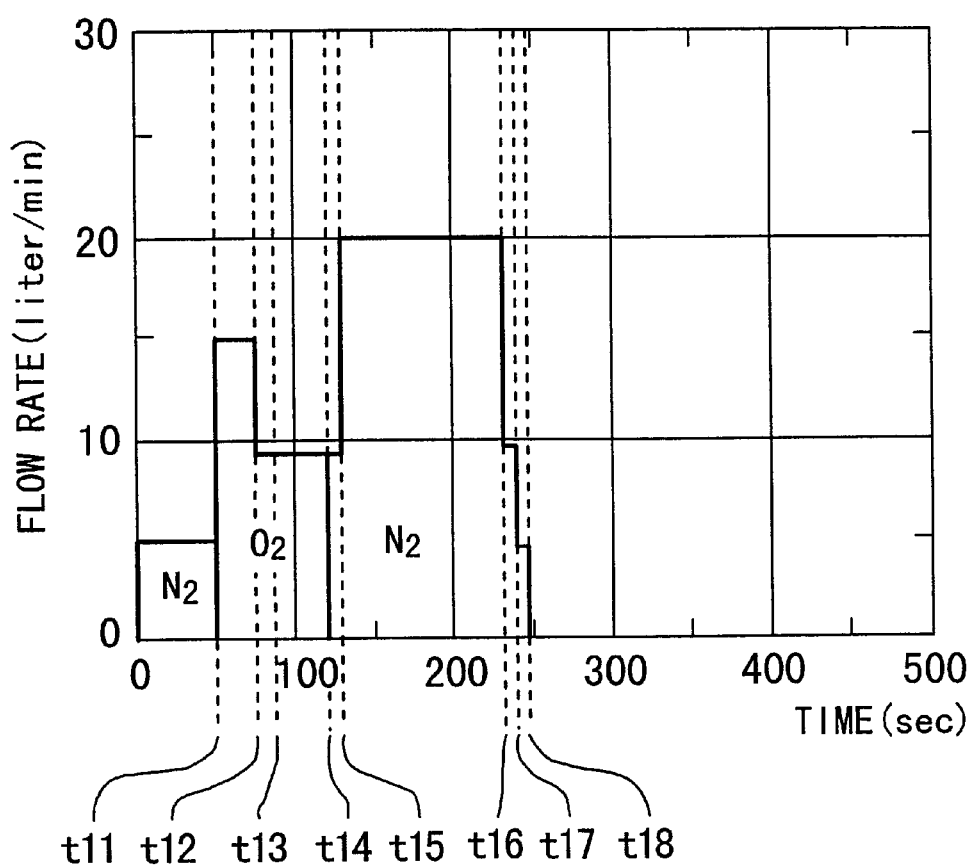
FIG. 7 is a graph showing change of flow rates of oxygen gas and nitrogen gas introduced into a heating furnace with respect to time, in the method for fabricating an oxide film according to the second embodiment of the present invention.
Figure 8:
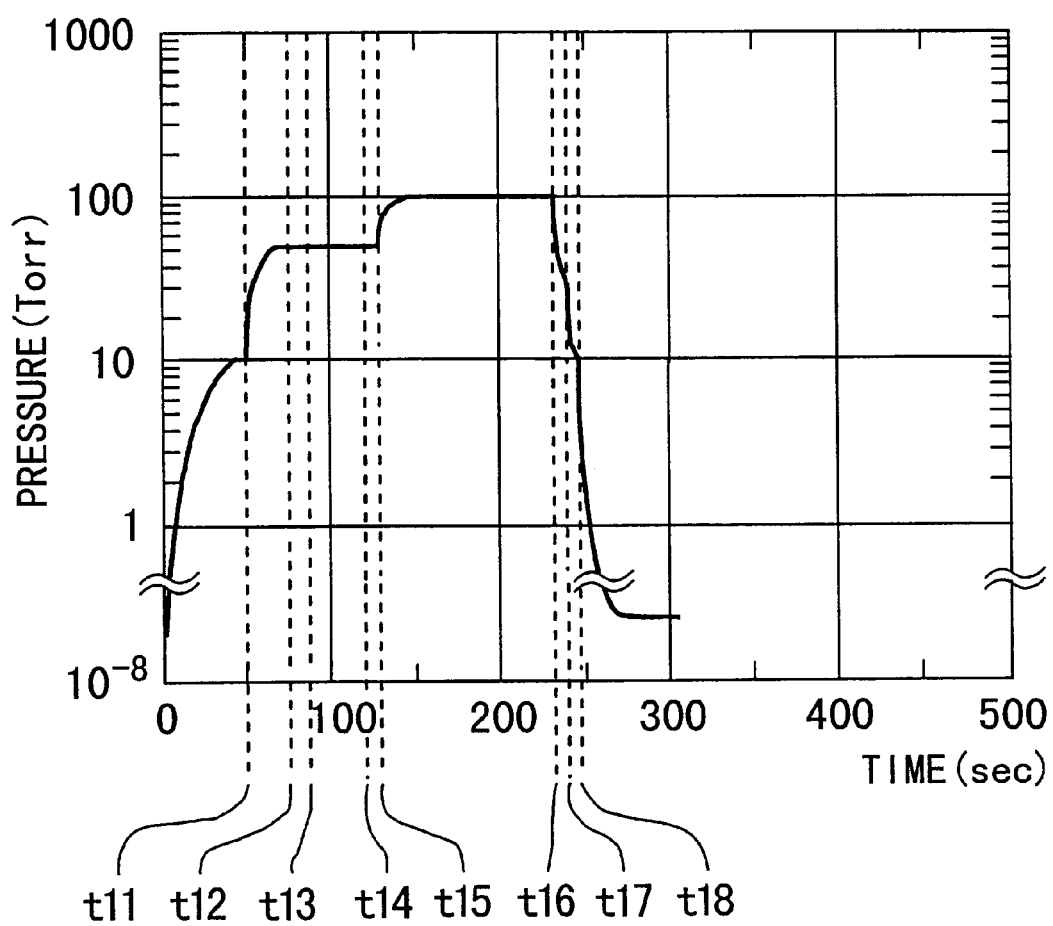
FIG. 8 is a graph showing change of pressure in a heating furnace with respect to time, in the method for fabricating an oxide film according to the second embodiment of the present invention.
Figure 9:
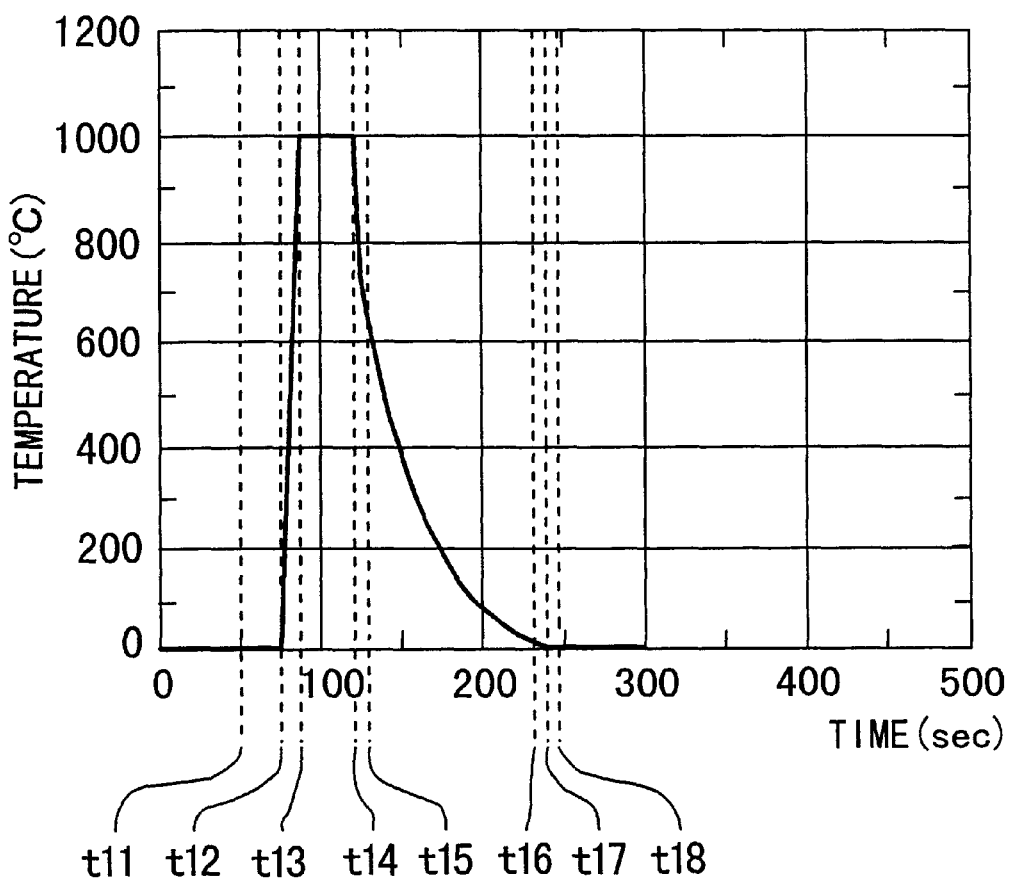
FIG. 9 is a graph showing change of temperature of a Si substrate in a heating furnace with respect to time, in the method for fabricating an oxide film according to the second embodiment of the present invention.

A method for fabricating an oxide film according to the second embodiment of the present invention will now be described in further detail. FIG. 7 illustrates a change of flow rates (liter/minute) of gases introduced into the heating furnace 110 with respect to time in this embodiment. FIG. 8 illustrates a change of pressure (Torr) within the heating furnace 110 with respect to time in this embodiment. FIG. 9 illustrates a change of temperature (degree Celsius) of the Si substrate 118 within the heating furnace 110 with respect to time in this embodiment.

First, the Si substrate 118 is introduced into the heating furnace 110 previously evacuated, and placed on the substrate supporting bars 116. Then, as shown in FIG. 7, nitrogen gas (N2) is introduced into the heating furnace 110 from the gas inlet 120, at a flow rate of, for example, 5 liters/minute. Alternatively, after introducing the Si substrate 118 into the heating furnace 110 of the atmospheric ambient pressure and placing it on the substrate supporting bars 116, the heating furnace 110 is evacuated and thereafter nitrogen gas is introduced into the heating furnace 110 from the gas inlet 120. For the sake of simplicity of explanation, the origin (t0) of each of the time axes (abscissas) of FIGS. 7, 8 and 9 is adjusted to the start time of introduction of nitrogen gas into the heating furnace 110. As shown in FIG. 8, the controller 130 controls the rate of opening of the valve 126 so that the pressure within the heating furnace 110 becomes approximately 10 Torr at time t11, that is, approximately 50 seconds after t0. One of the reasons for introducing nitrogen gas is to prevent formation of natural 10 oxide film on the surface of the Si substrate 118. If the natural oxide film is formed on the surface of the Si substrate 118, the film thickness of the finished SiO2 film disperses and it is difficult to control the film thickness into a predetermined thickness precisely. It is also possible to introduce a very small quantity, for example, 100 ppm, of oxygen into the heating furnace 110 together with the nitrogen, in order to avoid occurrence of the roughness of the surface of the Si substrate 118. Also, other reason for introducing nitrogen gas is to replace ambient within the heating chamber 110 once by a gas comprising 100 percent nirigen, and to make control of oxidation pressure thereafter easier.

As shown in FIG. 7, at time t11, introduction of nitrogen gas from the gas inlet 120 is stopped, and introduction of oxygen gas (O2) is started from the gas inlet 122 at a flow rate of, for example, 15 liters/minute. Thereafter, at time t12, flow rate of oxygen gas introduced from the gas inlet 122 is reduced, for example, to 9 liters/minute. The controller 130 controls the valve 126 such that pressure within the heating furnace 110 becomes approximately 50 Torr. The reason for setting the flow rate of oxygen gas from t11 to t12 larger than the flow rate of oxygen gas from t12 to t14 is to quickly change the ambient within the heating furnace 110, that is, the ambient around the Si substrate 118, from a gas comprising 100 percent nitrogen to a gas comprising 100 percent oxygen, and to quickly raise the pressure within the heating furnace 110 to a constant pressure, in this case, 50 Torr, as shown in FIG. 8.

As shown in FIG. 9, at time t12, for example, approximately 75 seconds after t0, heating of the Si substrate 118 by the halogen lamps 12 is started to begin temperature rise of the Si substrate, and at time t13, for example, approximately 90 seconds after t0, the temperature of the Si substrate 118 reaches a constant oxidation temperature, for example, approximately 1000 degrees Celsius. The temperature of the Si substrate 118 is, as shown in FIG. 9, maintained at this oxidation temperature, that is, approximately 1000 degrees Celsius, from the time t13 to t14, for example, approximately for 30 seconds. During this time period, the silicon oxide film (SiO2 film) having the thickness of, for example, 20 angstroms, is formed on the Si substrate 118.

At time t14, for example, approximately 120 seconds after t0, the heating of the Si substrate 118 by the halogen lamps 112 is stopped, and thereafter entering into a temperature falling down process. On the other hand, as shown in FIG.

7, at time t14, introduction of oxygen from the gas inlet 122 is stopped, and introduction of nitrogen gas is started from the gas inlet 120 at a flow rate of, for example, approximately 9 liters/minute. Further, at time t15, for example, approximately 130 seconds after t0, flow rate of nitrogen gas is increased to, for example, approximately 20 liters/minute. As shown in FIG. 8, after the time t15, the controller 130 controls the valve 126 such that the pressure within the heating furnace 110 becomes approximately 100 Torr. Since the pressure within the heating furnace 110 is raised, cooling rate of the Si substrate 118 becomes fast. It is also possible to reduce the temperature of the Si substrate 118 more rapidly by setting the pressure within the heating furnace 110 to a higher pressure, for example, the atmospheric pressure, after the time t14 or t15, such that the Si substrate 118 can be removed from the heating furnace 110 more rapidly. In this case, in order to rapidly replace the ambient within the heating furnace 110, it is better not to raise the pressure within the heating furnace 110 too high.

Due to the stop of introduction of oxygen gas and the start of introduction of nitrogen gas at the time t14, the ambient within the heating furnace 110 is replaced from a gas comprising 100 percent oxygen to a gas comprising 100 percent nitrogen. Therefore, after the time t14, substantially no SiO2 film is formed on the Si substrate 118. Also, other reason for introducing nitrogen gas into the heating furnace 110 after the time t14 is to reduce the temperature of the Si substrate 118 rapidly, by introducing a gas having large specific heat. This is because, if the pressure within the heating furnace 110 is low, heat conduction through gas molecules is suppressed, thereby the temperature of the Si substrate 118 can not fall quickly. Therefore, in place of or in addition to the nitrogen gas, any gas which does not contribute to oxidation can be used. For example, helium (He), argon (Ar), hydrogen (H2), and the like can be used. In this case, as the specific heat of the gas becomes larger, the temperature of the Si substrate falls down more quickly. When hydrogen gas is used, it is necessary to introduce the hydrogen gas into the heating furnace 110 after replacing oxygen gas with other gas which does not react with hydrogen.

Thereafter, as shown in FIG. 7, flow rate of nitrogen gas is reduced stepwise to, for example, approximately 10 liters/minute at time t16, for example, 230 seconds after t0, and to, for example, approximately 5 liters/minute at time t17, and at time t18, for example, 245 seconds after t0, introduction of nitrogen gas is stopped. After the time t16, if the gas outlet 124 is in open condition, the pressure within the heating furnace 110 decreases in accordance with the reduction of introduction of nitrogen gas, as shown in FIG. 8.

After the time t18, temperature of the Si substrate 118 * returns approximately to the room temperature, and, therefore, after, for example, 300 seconds from the time t0, it is easily possible to take out the Si substrate 118 from the heating furnace 110. In the actual experiment performed as mentioned above, the thickness of the SiO2 film formed on the Si substrate 118 was approximately 20 angstroms and error thereof was within +/-1 angstrom. It is also possible to stop evacuation of the heating furnace 110 after, for example, the time t16, and to fill the heating furnace 110 with nitrogen to return to the atmospheric pressure, thereafter removing the Si substrate 118 from the heating furnace 110.

Figure 10:
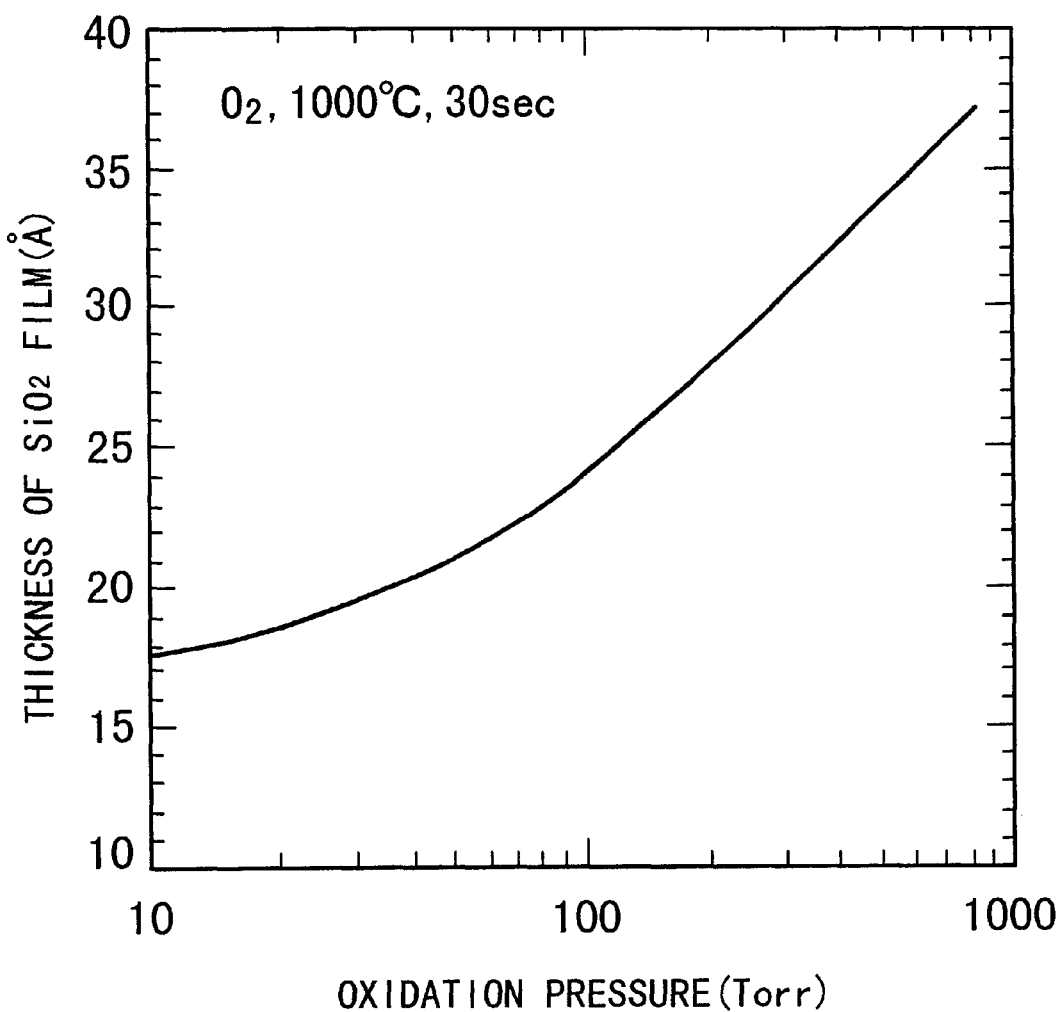
FIG. 10 is a graph showing a relation between film thickness of a formed SiO2 film versus oxidation pressure, when a Si substrate is oxidized at an oxidation temperature of 1000 degrees Celsius and oxidation time of 30 seconds, and when only ambient pressure is changed, to form SiO2 film.

FIG. 10 is a graph showing a relation between the thickness of a formed SiO2 film and oxidation pressure when the SiO2 film is formed on a Si substrate while varying oxidation pressure, that is, pressure of oxygen ambient in the heating furnace 110 during the time t13 through the time t14. In this case, oxidation temperature, that is, temperature of the Si substrate during the time t13 through t14 in FIG. 9, is maintained at 1000 degrees Celsius, and oxidation time, that is, time period from t13 to t14, is fixed to 30 seconds. FIG. 10 is substantially the same as FIG. 5, except that abscissa of FIG. 5 designates partial pressure of oxygen, that is, partial pressure of oxygen of the mixed gas ambient, while abscissa of FIG. 10 designates the oxidation pressure, that is, pressure of oxygen ambient. For example, as shown in FIG. 10, it is possible to fabricate the SiO2 film having the thickness of 20 angstroms in the oxidation pressure of approximately 35 Torr. As apparent from FIG. 10, when the thickness of the SiO2 film should be controlled to become any desired value, it is only necessary to change the oxidation pressure depending on the required film thickness to oxidize the Si substrate, while maintaining the conditions of oxidation temperature and oxidation time at constant values, for example, 1000 degrees Celsius and 30 seconds, respectively. For example, when the oxidation temperature is maintained at 1000 degrees Celsius and the oxidation time is fixed to 30 seconds, oxidation pressure may be adjusted to approximately 35 Torr if the SiO2 film having the thickness of 20 angstroms should be formed, to approximately 110 Torr if the SiO2 film having the thickness of 25 angstroms should be formed, and to approximately 300 Torr if the SiO2 film having the thickness of 30 angstroms should be formed. The oxidation pressure can be easily and precisely controlled, for example, by adjusting the pressure within the heating furnace by using the above-mentioned controller 130. Also, it is possible to control the formed thickness of the SiO2 film by adjusting the oxidation pressure, while the oxidation temperature and the oxidation time are fixed to other values, for example, an arbitrary value approximately between 900 and 1200 degrees Celsius and an arbitrary value equal to or larger than approximately 20 seconds, respectively. In this case, although the oxidation pressure can be adjusted to any value within an implementable pressure range, it is practically more preferable to use a value within a range between approximately 10 and 700 Torr.

According to the method for fabricating an oxide film of the second embodiment, it is possible to form the SiO2 film having a desired thickness very precisely, and to control the thickness of the SiO2 film easily and precisely. Especially, thickness of a thin SiO2 film having the thickness of, for example, approximately 20 through 30 angstroms can be controlled properly. Also, it is possible to fabricate oxide films having various thickness easily and precisely by using a common apparatus.

Also, it is possible to use the heating furnace 110 used in the second embodiment and shown in FIG. 6 to implement the method for fabricating the oxide film of the first embodiment. If such heating furnace 110 is used, it is also possible to keep the total pressure of the ambient within the heating furnace in a condition of reduced pressure or in a decompressed condition, in the first embodiment.

According to the present invention, it is possible to form a very thin oxide film having a predetermined thickness precisely. Also, according to the present invention, the oxidation film, such as SiO2 film, can be formed with uniform thickness on a Si substrate. Especially, according to the present invention, it is possible, in a MOS transistor, to form a gate oxide film having the thickness of approximately 20 angstroms which is required in the 0.13 micron rule can be formed within the tolerance of +/-1 angstrom.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method for fabricating an oxide film by oxidizing a substrate in an ambient including oxygen to form said oxide film on said substrate for a predetermined time of oxidation and at a predetermined temperature of oxidation, the method comprising:

controlling the thickness of said oxide film to be formed, by adjusting the partial pressure of oxygen in said ambient including oxygen without changing the temperature of oxidation of said substrate or time of oxidation of said substrate, said thickness of the oxide film on the substrate being 30 angstroms or less, said time of oxidation being 20 seconds or longer, and said temperature ranging from 900° C. to 1200° C., wherein said substrate is a silicon substrate, and said oxidation film is a silicon oxide film, and wherein the total pressure of said ambient including oxygen is substantially the atmospheric pressure, and the partial pressure of oxygen of said ambient including oxygen is substantially lower than the atmospheric pressure.

2. The method according to claim 1 wherein the thickness of the oxide film on the substrate ranges from 20 to 30 angstroms.

3. A method for fabricating an oxide film by oxidizing a substrate in an oxidizing ambient to form said oxide film on said substrate for a predetermined time and at a predetermined temperature, the method comprising:

controlling the thickness of said oxide film to be formed, by adjusting the pressure of said oxidizing ambient without changing the temperature of oxidation of said substrate or time of oxidation of said substrate, said thickness of the oxide film on the substrate being 30 angstroms or less, said time of oxidation being 20 seconds or longer and said temperature ranging from 900° C. to 1200° C., wherein said substrate is a silicon substrate, and said oxidation film is a silicon oxide film and the pressure of said oxidizing ambient is a pressure substantially lower than the atmospheric pressure.

4. The method according to claim 3 wherein the thickness of the oxide film on the substrate ranges from 20 to 30 angstroms.

5. A method for fabricating an oxide film by oxidizing a silicon substrate in an ambient including oxygen to form a silicon oxide film on said silicon substrate for a predetermined time of oxidation and at a predetermined temperature of oxidation, the method comprising:

introducing said silicon substrate into a heating furnance;

filling said heating furnace with a mixed gas including oxygen and keeping the partial pressure of oxygen in the ambient within said heating furnace at a predetermined partial pressure;

heating said silicon substrate to a predetermined temperature while keeping said partial pressure of oxygen in said ambient within said heating furnace at said predetermined partial pressure;

after the temperature of said silicon substrate reaches said predetermined temperature, maintaining the temperature of said silicon substrate at said predetermined temperature for a predetermined time and, without changing the predetermined temperature and said predetermined time, either maintaining said partial pressure of oxygen in said ambient within said heating furnace at said predetermined partial pressure or adjusting said predetermined partial pressure of oxygen, the thickness of the oxide film on the substrate being controlled by the partial pressure of oxygen in said ambient within said heating furnace; and after maintaining the temperature of said silicon substrate at said predetermined temperature for said predetermined time period, reducing the temperature of said silicon substrate and replacing the ambient within said heating furnace from said mixed gas including oxygen to one or more gases which do not contribute to oxidation, said thickness of the oxide film on the substrate being 30 angstroms or less, said predetermined time being at least twenty seconds, said predetermined temperature ranging from 900° C. to 1200° C. and said predetermined partial pressure being lower than atmospheric pressure.

6. The method as set forth in claim 5 wherein said predetermined partial pressure is within a range from 10 to 700 Torr.

7. A method for fabricating an oxide film by oxidizing a silicon substrate in an oxidizing ambient to form a silicon oxide film on said silicon substrate for a predetermined time of oxidation and a predetermined temperature of oxidation, the method comprising:

introducing said silicon substrate into a heating furnace;

introducing oxygen gas into said heating furnace and keeping the pressure of the oxidizing ambient within said heating furnace at a predetermined pressure;

heating said silicon substrate to a predetermined temperature while keeping said pressure of oxidizing ambient within said heating furnace at said predetermined pressure;

after the temperature of said silicon substrate reaches said predetermined temperature, maintaining the temperature of said silicon substrate at said predetermined temperature for a predetermined time period, and without varying the predetermined temperature and predetermined time, either maintaining said pressure of the oxidizing ambient within said heating furnace at said predetermined pressure or adjusting said predetermined pressure of the oxidizing ambient, the thickness of the oxide film on the substrate being controlled by the partial pressure of the oxidizing ambient; and after maintaining the temperature of said silicon substrate at said predetermined temperature for said predetermined time period, reducing the temperature of said silicon substrate and also introducing one or more gases which do not contribute to oxidation in said heating furnace to replace the ambient within said heating furnace from said oxidizing ambient to one or more gases which do not contribute to oxidation, and maintaining pressure of the ambient within said heating furnace higher than said predetermined pressure, the thickness of the oxide film being 30 angstroms or less, the predetermined time being at least 20 seconds, the predetermined temperature ranging from 900° C. to 1200° C., and the predetermined pressure of the oxidizing ambient being lower than atmospheric pressure.

8. The method as set forth in claim 7 wherein said predetermined pressure is within a range from 10 to 700 Torr.

9. The method according to claim 5 wherein the thickness of the oxide film on said substrate ranges from 20 to 30 angstroms.

10. The method according to claim 7 wherein the thickness of the oxide film on said substrate ranges from 20 to 30 angstroms.

11. The method according to claim 1 wherein the time of oxidation is about 30 seconds.

12. The method according to claim 3 wherein the time of oxidation is about 30 seconds.

13. The method according to claim 5 wherein the time of oxidation is about 30 seconds.

14. The method according to claim 7 wherein the time of oxidation is about 30 seconds.

15. The method as set forth in claim 1, wherein said ambient including oxygen comprises a mixed gas of oxygen gas and one or more gases which do not contribute to oxidation.

16. The method as set forth in claim 15, wherein partial pressure of oxygen in said ambient including oxygen is controlled by adjusting a ratio of flow rates of said oxygen gas and said one or more gases which do not contribute to oxidation.

17. The method as set forth in claim 15, wherein said one or more gases which do not contribute to oxidation are selected from a group consisting of nitrogen, helium and argon.

18. The method as set forth in claim 1, wherein said oxide film is a gate oxide film of a MOS transistor.

19. The method as set forth in claim 3, wherein said oxidizing ambient is an oxygen ambient.

20. The method as set forth in claim 3, wherein said oxide film is a gate oxide film of a MOS transistor.

21. The method as set forth in claim 5, wherein said mixed gas including oxygen comprises a mixed gas of oxygen gas and one or more gases which do not contribute to oxidation.

22. The method as set forth in claim 21, wherein said one or more gases which do not contribute to oxidation are selected from a group consisting of nitrogen, helium and argon.

23. The method as set forth in claim 5, wherein said method further comprises introducing one or more gases which do not contribute oxidation into said heating furnace, after introducing said silicon substrate into said heating furnace and before filling said heating furnace with said mixed gas including oxygen and keeping partial pressure of oxygen in said ambient within said heating furnace at said predetermined partial pressure.

24. The method as set forth in claim 5, wherein said predetermined partial pressure is approximately 50 Torr, said predetermined temperature is approximately 1000 degrees Celsius, and said predetermined time is approximately 30 seconds.

25. The method as set forth in claim 5, wherein said silicon oxide film is a gate oxide film of a MOS transistor.

26. The method as set forth in claim 7, wherein said oxidizing ambient is oxygen ambient.

27. The method as set forth in claim 7, wherein said method further comprises introducing one or more gases which do not contribute oxidation into said heating furnace, after introducing said silicon substrate into said heating furnace and before introducing oxygen gas into said heating furnace and keeping pressure of oxidizing ambient within said heating furnace at said predetermined pressure.

28. The method as set forth in claim 7, wherein maintaining pressure of the ambient within said heating furnace higher than said predetermined pressure is continued until the temperature of said silicon substrate reduces approximately to the room temperature.

29. The method as set forth in claim 7, wherein said predetermined pressure is approximately 50 Torr, said pressure higher than said predetermined pressure is approximately 100 Torr, said predetermined temperature is approximately 1000 degrees Celsius, and said predetermined time is approximately 30 seconds.

30. The method as set forth in claim 7, wherein said one or more gases which do not contribute to oxidation are selected from a group consisting of nitrogen, helium, argon and hydrogen.

31. The method as set forth in claim 7, wherein said silicon oxide film is a gate oxide film of a MOS transistor.

* * * * *

UNITED STATES PATENT AND TRADEMARK OFFICE
CERTIFICATE OF CORRECTION

PATENT NO.   : 6,258,731 B1
DATED        : July 10, 2002
INVENTOR(S)  : Koichi Ando It is certified that error appears in the above-identified patent and that said Letters Patent is hereby corrected as shown below:

<u>Title page,</u>
Item [56], References Cited, U.S. PATENT DOCUMENTS,
"5,521,126" should read -- 5,552,126 --

<u>Column 11,</u>
Line 46, "t18,for" should read -- t18, for --
Line 52, "t18,temperature" should read -- t18, temperature --

Signed and Sealed this

Nineteenth Day of November, 2002

Attest:

Attesting Officer

JAMES E. ROGAN
*Director of the United States Patent and Trademark Office*